(12) United States Patent
Liang et al.

(10) Patent No.: US 8,329,587 B2
(45) Date of Patent: Dec. 11, 2012

(54) POST-PLANARIZATION DENSIFICATION

(75) Inventors: Jingmei Liang, San Jose, CA (US);
Nitin K. Ingle, San Jose, CA (US);
Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 145 days.

(21) Appl. No.: 12/787,791

(22) Filed: May 26, 2010

(65) Prior Publication Data

US 2011/0081782 A1    Apr. 7, 2011

Related U.S. Application Data

(60) Provisional application No. 61/248,693, filed on Oct. 5, 2009.

(51) Int. Cl.
*H01L 21/311* (2006.01)
(52) U.S. Cl. ........ 438/697; 438/424; 438/692; 438/695; 438/698
(58) Field of Classification Search .......... 438/692, 438/693, 700, 723, 747, 756, 359, 424, 697, 438/698
See application file for complete search history.

(56) References Cited

U.S. PATENT DOCUMENTS

| | | | |
|---|---|---|---|
| 5,981,354 A | 11/1999 | Spikes et al. | |
| 7,074,690 B1 | 7/2006 | Gauri et al. | |
| 7,524,735 B1 | 4/2009 | Gauri et al. | |
| 7,582,555 B1 | 9/2009 | Lang et al. | |
| 7,629,227 B1 | 12/2009 | Wang et al. | |
| 2004/0212036 A1* | 10/2004 | Li et al. | 257/510 |
| 2005/0153519 A1* | 7/2005 | Lu et al. | 438/424 |
| 2007/0020875 A1* | 1/2007 | Hsu et al. | 438/424 |
| 2007/0066005 A1 | 3/2007 | Hieda et al. | |
| 2007/0207590 A1* | 9/2007 | Kiyotoshi et al. | 438/424 |
| 2009/0085096 A1* | 4/2009 | Park et al. | 257/324 |
| 2011/0212620 A1 | 9/2011 | Liang et al. | |

FOREIGN PATENT DOCUMENTS

| | | |
|---|---|---|
| KR | 10-2003-0012112 A | 2/2003 |
| KR | 10-2008-0060348 A | 7/2008 |
| KR | 10-2008-0114025 A | 12/2008 |

* cited by examiner

*Primary Examiner* — Lan Vinh
(74) *Attorney, Agent, or Firm* — Kilpatrick Townsend & Stockton LLP

(57) ABSTRACT

Processes for forming high density gap-filling silicon oxide on a patterned substrate are described. The processes increase the density of gap-filling silicon oxide particularly in narrow trenches. The density may also be increased in wide trenches and recessed open areas. The densities of the gap-filling silicon oxide in the narrow and wide trenches/open areas become more similar following the treatment which allows the etch rates to match more closely. This effect may also be described as a reduction in the pattern loading effect. The process involves forming then planarizing silicon oxide. Planarization exposes a new dielectric interface disposed closer to the narrow trenches. The newly exposed interface facilitates a densification treatment by annealing and/or exposing the planarized surface to a plasma.

16 Claims, 6 Drawing Sheets

POST-PLANARIZATION DENSIFICATION

CROSS REFERENCE TO RELATED APPLICATION

This application is a nonprovisional of, and claims the benefit of the filing date of U.S. Provisional Patent Application No. 61/248,693, filed Oct. 5, 2009, entitled "POST-PLANARIZATION ANNEAL" by Jingmei Liang et al., the entire disclosure of which is incorporated herein by reference for all purposes.

BACKGROUND OF THE INVENTION

Semiconductor device geometries have dramatically decreased in size since their introduction several decades ago. Modern semiconductor fabrication equipment routinely produce devices with 45 nm, 32 nm and 28 nm feature sizes; new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One class of approaches typically involves separate depositions surrounding etch back processes. This results in a dep-etch-dep sequence which may impose tighter process specifications for both deposition and etch. Another approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they may need to be cured and hardened into a solid dielectric material.

There is a need to produce alternative gap-filling films having less stress by modifying the deposition process and/or subsequent processing. There is also a need for these process sequences to produce films having similar properties in narrow and wide trenches. This and other needs are addressed in the present application.

BRIEF SUMMARY OF THE INVENTION

Processes for forming high density gap-filling silicon oxide on a patterned substrate are described. The processes increase the density of gap-filling silicon oxide particularly in narrow trenches. The density may also be increased in wide trenches and recessed open areas. The densities of the gap-filling silicon oxide in the narrow and wide trenches/open areas become more similar following the treatment which allows the etch rates to match more closely. This effect may also be described as a reduction in the pattern loading effect. The process involves forming then planarizing silicon oxide. Planarization exposes a new dielectric interface disposed closer to the narrow trenches. The newly exposed interface facilitates a densification treatment by annealing and/or exposing the planarized surface to a plasma.

Embodiments of the invention include methods of processing a silicon-and-oxygen-containing layer on a patterned substrate having a narrow trench and a recessed open area. The methods include forming a silicon-and-oxygen-containing layer on the patterned substrate including in the narrow trench and in the recessed open area. The methods include planarizing the silicon-and-oxygen-containing layer leaving a narrow gapfill portion in the narrow trench and a wide gapfill portion in the recessed open area. Planarizing the silicon-and-oxygen-containing layer includes removing a portion of the silicon-and-oxygen-containing layer above the narrow trench and exposing a post-planarization dielectric interface disposed closer to the narrow trench then a corresponding pre-planarization dielectric interface. The methods further include treating the substrate, after the planarizing operation, to increase a density of the narrow gapfill portion. During the treatment, the post-planarization dielectric interface disposed closer to the narrow trench allows the narrow gapfill portion to become denser than had the substrate been treated before the planarizing operation.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Figure 1:
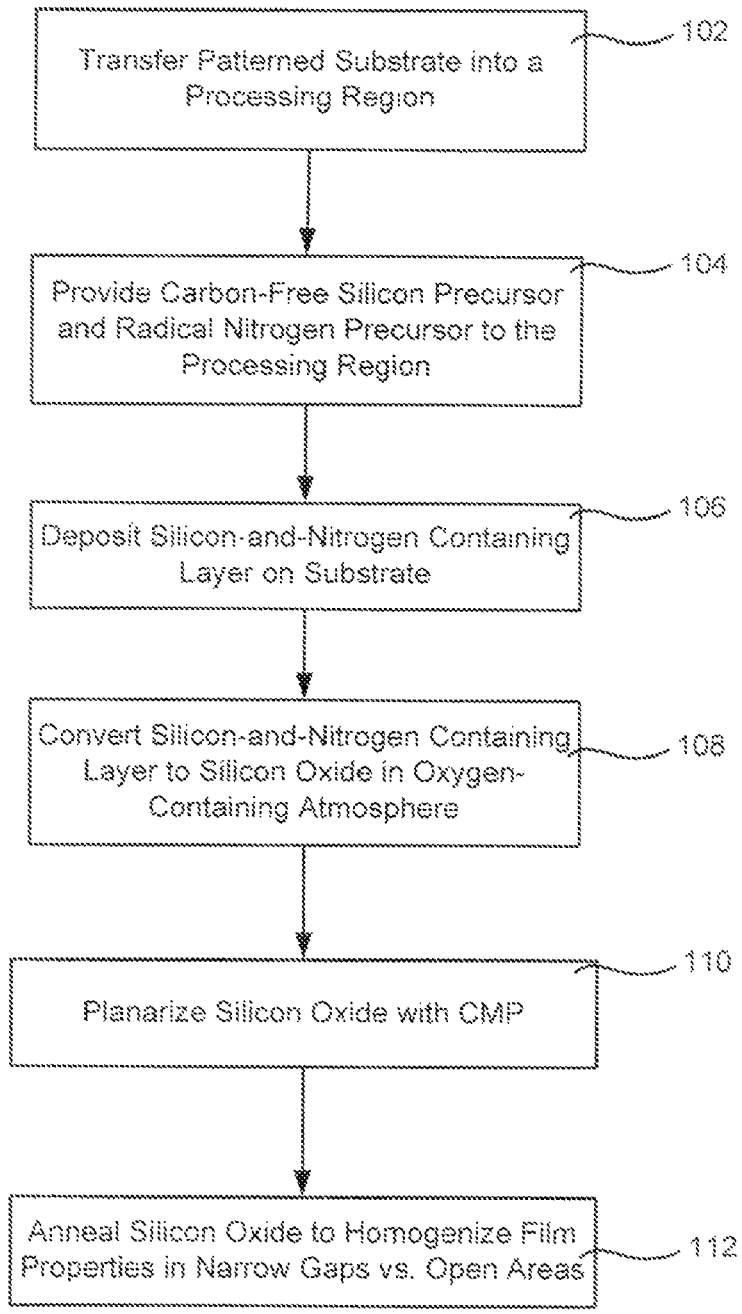
FIG. 1 is a flowchart illustrating selected steps for processing a silicon-containing film according to disclosed embodiments.

Processes for forming high density gap-filling silicon oxide on a patterned substrate are described. The processes increase the density of gap-filling silicon oxide particularly in narrow trenches. The density may also be increased in wide trenches and recessed open areas. The densities of the gap-filling silicon oxide in the narrow and wide trenches/open areas become more similar following the treatment which allows the etch rates to match more closely. This effect may also be described as a reduction in the pattern loading effect. The process involves forming then planarizing silicon oxide.

Planarization exposes a new dielectric interface disposed closer to the narrow trenches. The newly exposed interface facilitates a densification treatment by annealing and/or exposing the planarized surface to a plasma.

Dielectric within a trench may possess different properties from dielectric within an open area (or a wide trench). This may result from the more restricted geometry within a narrow trench compared to a wide trench. Following a planarizing step (e.g. a planarizing etch or chemical-mechanical polishing—CMP), the additional exposure to the surrounding atmosphere provides the ability to process the film stack so as to increase the density of the gapfill material and to make the properties of the material within the narrow trench and within the wide trench (or recessed open area) more similar. Dielectric films which benefit from the thermal processing include relatively less dense films such as silicon oxide deposited with PECVD, APCVD, FCVD, SOG etc. The methods may provide particular utility to films which are flowable during deposition such as flowable CVD (FCVD) and spin-on glass (SOG). The difference between properties within and outside the narrow trench may be evaluated by comparing the wet etch rate in a wet etch comprising, e.g., hydrogen fluoride HF. Silicon oxide will be used as a shorthand throughout to mean a silicon-and-oxygen-containing layer and includes films such as silicon oxycarbide and silicon oxynitride.

Without binding the coverage of the claims to hypothetical process mechanisms, heating a film stack following planarization is thought to restructure the network within the dielectric resulting in a reduction in wet buffered oxide etch (BOE) rate especially within trenches Annealing dielectric films at high temperatures has been found to transition a film from tensile to compressive stress. The removal of material like hydrogen from the dielectric is another possible mechanism and may occur at the same time as the restructuring. The region within narrow trenches is found to benefit more than the region within wide trenches and open areas. Silicon oxide is an example of a dielectric which benefits from a post-CMP anneal. The density of silicon oxide within restricted geometries (like narrow trenches) is increased during the post-CMP anneal which may cause the reduction in wet etch rate (WER). The physical curvature of the substrate as a whole may also be mitigated by the presence of the compressive layers during formation of the film and during subsequent processing.

Exposing the planarized dielectric surface to a plasma has also been found to provide similar benefits with regard to the densification of the gapfill dielectric. Ion bombardment of the planarized surface in the plasma-excited atmosphere appears to increase the density of the gapfill dielectric. Adding oxygen to the atmosphere excited by the plasma helps further increase the density in some cases by supplying oxygen which is incorporated into the silicon oxide. The oxygen can be incorporated into voids present in a relatively porous gapfill dielectric and/or may displace less-dense constituents which may also be more weakly bound to the material in the gapfill dielectric. Adding hydrogen in combination with the oxygen may also help increase the density of the gapfill dielectric as a result of the increase in moisture content.

Additional details will be provided in the course of describing several exemplary methods. FIG. 1 is a flowchart showing selected steps in a method 100 of making silicon oxide films according to embodiments of the invention. The method 100 includes transferring a patterned substrate having narrow gaps or trenches and recessed open areas into a reaction chamber 102. The recessed open areas may be wide trenches having a width greater than 50 nm, 100 nm, 200 nm, 500 nm or 1000 nm, in different embodiments. The narrow trench may have a width less than 100 nm, 70 nm, 50 nm, 35 nm, 25 nm or 20 nm, in different embodiments. The narrow trench may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). Filling the narrow trenches and recessed open areas begins by concurrently providing a carbon-free silicon precursor and a radical nitrogen precursor to substrate processing region 104.

The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of additional gases may include $H_2$, $N_2$, $NH_3$, $N_2H_4$, He, and Ar, among other gases. Examples of carbon-free silicon precursors may also include silane ($SiH_4$) either alone or mixed with other silicon-containing gases (e.g., $N(SiH_3)_3$), hydrogen-containing gases (e.g., $H_2$), and/or nitrogen-containing gases (e.g., $N_2$, $NH_3$, $N_2H_4$). Carbon-free silicon precursors may also include disilane, trisilane, higher-order silanes, and chlorinated silanes, alone or in combination with one another or the previously mentioned carbon-free silicon precursors. The silicon-precursor may be oxygen-free in addition to carbon-free. The lack of oxygen results in a lower concentration of silanol (Si—OH) groups in the silicon-and-nitrogen layer formed from the precursors. Excess silanol moieties in the deposited film can cause increased porosity and shrinkage during post deposition steps that remove the hydroxyl (—OH) moieties from the deposited layer.

The radical-nitrogen precursor is a nitrogen-radical containing species that was generated outside the reaction chamber from a more stable nitrogen precursor. For example, a stable nitrogen precursor such a $NH_3$ may be activated in a plasma unit outside the reaction chamber to form the radical-nitrogen precursor, which is then transported into the reaction chamber. The stable nitrogen precursor may also be a mixture comprising $NH_3$ & $N_2$, $NH_3$ & $H_2$, $NH_3$ & $N_2$ & $H_2$ and $N_2$ & $H_2$, in different embodiments. Hydrazine ($N_2H_4$) may be used in lieu of or in addition to $NH_3$, and may be combined with $N_2$ and/or $H_2$ as listed above. The radical-nitrogen precursor produced comprises plasma effluents which include one or more of .N, .NH, .$NH_2$, etc., and may also be accompanied by ionized species formed in the plasma.

A radical precursor may be a radical-nitrogen precursor if it includes nitrogen supplied with the aforementioned precursors to the remote plasma region. Generally speaking, a radical precursor which does not include nitrogen will also allow a silicon-and-nitrogen-containing layer to be formed. The radical precursor is generated in a section of the reaction chamber partitioned from a deposition region where the precursors mix and react to deposit the silicon-and-nitrogen layer on a deposition substrate (e.g., a semiconductor wafer). In an embodiment where the radical precursor is a radical-nitrogen precursor, a stable nitrogen precursor is flowed into the remote plasma region and excited by a plasma. The stable nitrogen precursor (and the radical-nitrogen precursor) may also be accompanied by a carrier gas such as hydrogen ($H_2$), nitrogen ($N_2$), argon, helium, etc. A radical-nitrogen precursor formed from an input gas consisting essentially of nitrogen ($N_2$) (with or without additional inert carrier gases) has also been found to produce beneficial films in disclosed embodiments. The radical-nitrogen precursor may also be replaced by a radical precursor formed from an input gas consisting essentially of hydrogen ($H_2$) (and optionally inert carrier gases) in embodiments where the silicon-containing precursor provides the nitrogen needed in the desired film. The precursors flowing into the plasma to be excited may be referred to herein as plasma precursors and the radical precursors flowing out of the plasma may be referred to as plasma effluents.

In the reaction chamber, the carbon-free silicon precursor and the radical-nitrogen precursor mix and react to deposit a silicon-and-nitrogen containing film on the deposition substrate 106. The deposited silicon-and-nitrogen-containing film may deposit conformally with some recipe combinations in embodiments. In other embodiments, the deposited silicon-and-nitrogen containing film has flowable characteristics unlike conventional silicon nitride ($Si_3N_4$) film deposition techniques. The flowable nature of the formation allows the film to flow into narrow gaps, trenches and other structures on the deposition surface of the substrate. The flowable film fills gaps with high aspect ratios without creating voids or weak seams around the center of the filling material, in embodiments. The flowable film is less likely to prematurely clog the top of a narrow gap or trench.

The flowability may be due to a variety of properties which result from mixing a radical-nitrogen precursors with carbon-free silicon precursor. These properties may include a significant hydrogen component in the deposited film and/or the presence of short chained polysilazane polymers. These short chains grow and network to form more dense dielectric material during and after the formation of the film. For example the deposited film may have a silazane-type, Si—NH—Si backbone (i.e., a Si—N—H film). When both the silicon precursor and the radical-nitrogen precursor are carbon-free, the deposited silicon-and-nitrogen containing film is also substantially carbon-free. Of course, "carbon-free" does not necessarily mean the film lacks even trace amounts of carbon. Carbon contaminants may be present in the precursor materials that find their way into the deposited silicon-and-nitrogen precursor. The amount of these carbon impurities however are much less than would be found in a silicon precursor having a carbon moiety (e.g., TEOS, TMDSO, etc.).

Following the deposition of the silicon-and-nitrogen-containing layer, the deposition substrate may undergo a treatment in an oxygen-containing atmosphere 108. The substrate is initially cured in an ozone-containing atmosphere in disclosed embodiments. The deposition substrate may remain in the substrate processing region for curing, or the substrate may be transferred to a different chamber where the ozone-containing atmosphere is introduced. The curing temperature of the substrate may be less than or about 400° C., less than or about 300° C., less than or about 250° C., less than or about 200° C. or less than or about 150° C. in different embodiments. The temperature of the substrate may be greater than or about room temperature, greater than or about 50° C., greater than or about 100° C., greater than or about 150° C. or greater than or about 200° C. in different embodiments. Any of the upper bounds may be combined with any of the lower bounds to form additional ranges for the substrate temperature according to additional disclosed embodiments. No plasma or substantially no plasma is applied to the substrate processing region during curing, in embodiments, to avoid generating atomic oxygen which may close the near surface network and thwart subsurface oxidation. The flow rate of the ozone into the substrate processing region during the cure step may be greater than or about 200 sccm, greater than or about 300 sccm or greater than or about 500 sccm which is typically accompanied by a larger flow of relatively more stable molecular oxygen. The partial pressure of ozone during the cure step may be greater than or about 10 Torr, greater than or about 20 Torr or greater than or about 40 Torr. Under some conditions (e.g. between substrate temperatures from about 100° C. to about 200° C.) the conversion has been found to be substantially complete so a relatively high temperature anneal in an oxygen-containing environment may be unnecessary in embodiments. In some embodiments, the planarization may occur following the ozone treatment just described.

In other embodiments, the exposure to an oxygen-containing atmosphere continues in the form of a higher temperature treatment. Following curing of the silicon-and-nitrogen containing layer, the deposition substrate may be annealed in an oxygen-containing atmosphere 110. The deposition substrate may remain in the same substrate processing region used for curing when the oxygen-containing atmosphere is introduced, or the substrate may be transferred to a different chamber where the oxygen-containing atmosphere is introduced. The oxygen-containing atmosphere may include one or more oxygen-containing gases such as molecular oxygen ($O_2$), ozone ($O_3$), water vapor ($H_2O$), hydrogen peroxide ($H_2O_2$) and nitrogen-oxides (NO, $NO_2$, etc.), among other oxygen-containing gases. The oxygen-containing atmosphere may also include radical oxygen and hydroxyl species such as atomic oxygen (O), hydroxides (OH), etc., that may be generated remotely and transported into the substrate chamber. Ions of oxygen-containing species may also be present. The oxygen anneal temperature of the substrate may be less than or about 1100° C., less than or about 1000° C., less than or about 900° C. or less than or about 800° C. in different embodiments. The temperature of the substrate during the oxygen anneal may be greater than or about 500° C., greater than or about 600° C., greater than or about 700° C. or greater than or about 800° C. in different embodiments. Any of the upper bounds may be combined with any of the lower bounds to form additional ranges for the substrate temperature according to additional disclosed embodiments. The patterned substrate may additionally be annealed in an inert environment at even higher temperatures. The temperature of the substrate during the inert anneal may be greater than or about 800° C., greater than or about 900° C., greater than or about 1000° C. or greater than or about 1100° C. in different embodiments.

The patterned substrate is then transferred to a chemical-mechanical polishing (CMP) tool. The silicon oxide on the patterned substrate is polished to planarize the silicon oxide layer 110. Planarizing processes such as CMP typically remove material which extends farther away from the substrate more rapidly than recessed material which can result in greater planarity over a selectable lateral length scale. The lateral length scale is typically significantly less than the "length" or diameter of the substrate. Other techniques may be used to planarize the surface including etch processes tuned to preferentially remove silicon oxide which extends above recessed areas. Material from both extended and recessed areas is removed in embodiments. After planarization using CMP, a post-planarization dielectric interface is formed disposed closer to the patterned substrate than the pre-polish interface.

The post-planarization dielectric interface allows the material within (especially) narrow trenches to be treated to increase density beyond what would be possible prior to the planarization. The substrate may be cured and annealed 112 as described before planarization including all the process parameter ranges and atmospheres presented the discussion associated with operation 108. The post-planarization dielectric interface enables the same embodiments presented above to further increase the density of material in all recessed areas but especially within the narrow trenches. The presence of the oxygen combined with the closer proximity of the post-planarization dielectric interface to the narrow trenches, may allow unreacted nitrogen left in the film to be further displaced by oxygen. In other words, the oxygen exposure may further the conversion from silicon-and-nitrogen-containing layer to silicon-and-oxygen-containing layer in regions which were simply too far away from the interface before planarization. The additional densification made possible after CMP shows that the $SiO_2$ network within a trench may be maintained by the overlying dielectric layer. Once the overlying layer has been removed, the $SiO_2$ within the trench is free to restructure during the post-CMP anneal. The restricted geometry of the trench may help to constrain network restructuring during the pre-CMP anneal while the renewed exposure after CMP allows significant additional network restructuring to occur. The oxygen-containing atmosphere may include the oxygen-containing compounds and radicals described earlier. The oxygen-containing atmosphere may further include hydrogen, in embodiments, to increase moisture, facilitate network restructuring and increase the density within recessed areas.

The anneal before the planarization step may be modified as a result of the introduction of the post-planarization anneal. Rather than densifying the film in preparation for downstream processing, the pre-CMP anneal only needs to densify the film so it will tolerate the CMP step. This may reduce or eliminate the need for the high temperature portion of the treatment. In embodiments, the film requires a low temperature cure in an ozone-containing environment. In other embodiments, the film requires a low temperature cure in an ozone-containing environment and a low temperature anneal in an oxygen-containing environment. In addition to delamination and polishing uniformity considerations, the pre-CMP anneal should be chosen to allow tolerable defect levels. Inclusion of a post-planarization anneal can potentially be used to reduce, mitigate, control or prevent film cracking for flowable films during processing since the pre-CMP anneal may have a lower thermal load than the post-CMP anneal. The post-CMP anneal may possess a high temperature, but the thickness of the film is reduced which may reduce the chance of film cracking during the anneal.

In some embodiments, the patterned substrate comprises a narrow trench and a recessed open area, each of which is filled with silicon oxide as described above. As a result of a variety of effects, the density of the silicon oxide within the narrow trench may be less than the density of the silicon oxide within the recessed open area. This can be determined by measuring the wet etch rate when each material is exposed to a hydrofluoric acid based etching solution (e.g. a 6:1 buffered oxide etch solution). A specific test structure was used to demonstrate the benefits of methods according to disclosed embodiments on in-trench film quality. The structure has 60-120 nm width trenches and open areas.

Figure 2A:
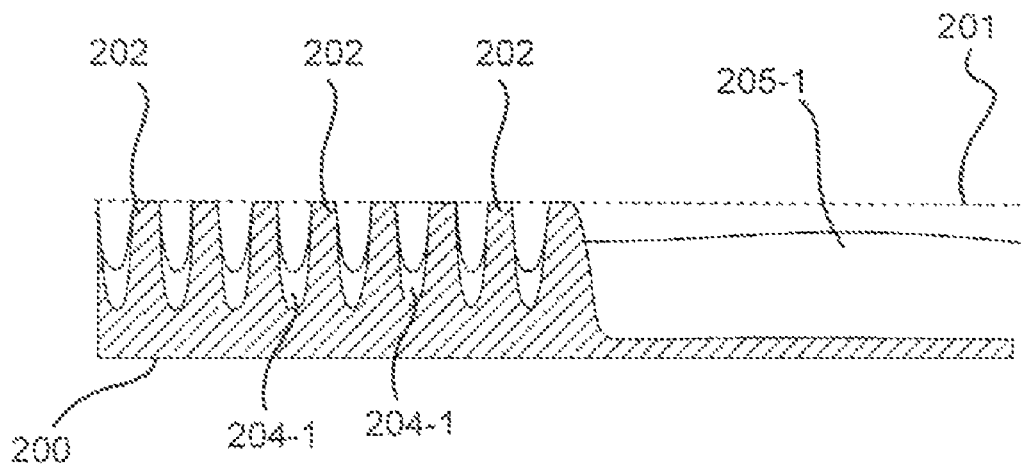
FIG. 2 is a cross-sectional schematic of an etched silicon oxide film and an etched silicon oxide film prepared according to disclosed embodiments.
Figure 2B:
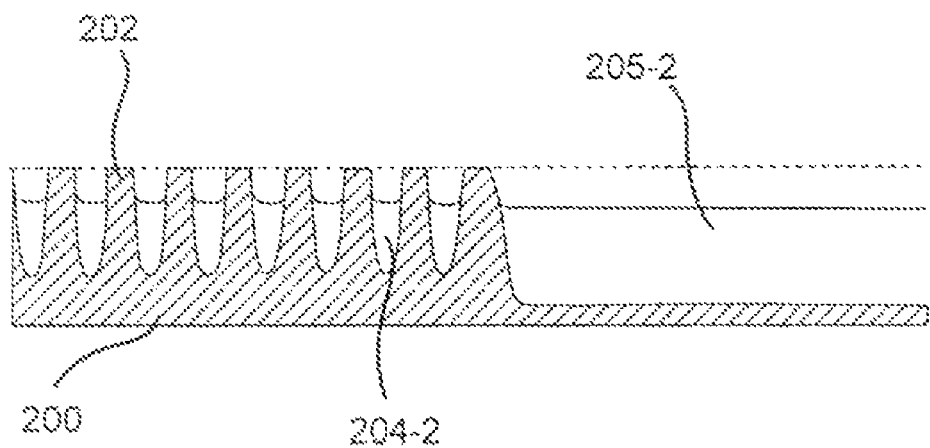

FIGS. 2A-2B are cross-sectional schematics of an etched gapfill silicon oxide film and an etched gapfill silicon oxide film processed according to disclosed embodiments. The schematic in FIG. 2A shows a support substrate 200 with multiple trenches between trench walls 202. The full wafer was deposited with a flowable silicon-and-nitrogen-containing film which was then cured and annealed at 200° C.-400° C. in steam and at 800° C.-1100° C. in $N_2$. The wafer was then planarized using CMP to the top of trenches on the patterned substrate. A nitride stop layer was present to help stop the polishing at the desired location. The location of the post-planarization dielectric interface is shown with dotted line 201. After a wet etch for 10 seconds in a 6:1 BOE the remaining silicon oxide in the narrow trenches 204-1 and the recessed open area 205-1 is shown using solid lines. The amount of material removed may be referred to as the wet recess and is proportional to the WER. The wet recess may be different in different regions, e.g. the recess may vary with the width of the trench. The etch rate of the narrow gapfill portions 204-1 is greater than that of the wide gapfill portion 205-1 resulting in the lower post-etch dielectric interface. The wet recess was about 90 nm in narrow trenches having 65 nm trench width and about 36 nm in the open area.

Another wet etch rate comparison after a post-CMP anneal (in an inert environment) is shown in FIG. 2B. The heights of the narrow gapfill portions 204-2 and wide gapfill portion 205-2 are now similar because of the increased density in the narrow gapfill portion. The wet recess in the different regions are substantially matched in the cross-sectional schematic of FIG. 2B. The wet recess was reduced to 34 nm in the narrow trenches and to 30 nm in the open area.

The density of both the narrow gapfill portions 204-2 and the wide gapfill portion 205-2 have increased during the post-CMP anneal, however, the density in the narrow gapfill portion increased more significantly. This allows the WER of the narrow gapfill portion to become more similar to the WER of the wide gapfill portion. The etch rate of the wide gapfill portion, after treating the substrate to increase a density, is within one of 20%, 15%, 10%, 7%, 5% or 3% of the etch rate of the narrow gapfill portion.

The methods presented herein are described using an exemplary silicon-and-nitrogen-containing film which is subsequently treated to become a silicon oxide film. It should be noted that the methods may be used on silicon oxide as well as other dielectric gapfill films (e.g. SiON, SiOC) deposited using a variety of methods including SACVD, HARP/eHARP films (also known as TEOS-ozone silicon oxide/TEOS-ozone-$H_2O$ silicon oxide), Spin-On-Glass (SOG), Plasma-Enhanced CVD (PECVD) silicon oxide, Flowable CVD (FCVD) silicon oxide, Sub-Atmospheric CVD (SACVD) silicon oxide. The films may be undoped silicate glass (USG) or may be doped (e.g. Boron-Phosphate Silicate Glass—BPSG). Increasing the density within a trench and recessed open areas may involve re-flowing the gapfill material or healing the seam which may form during conformal deposition.

Figure 3:
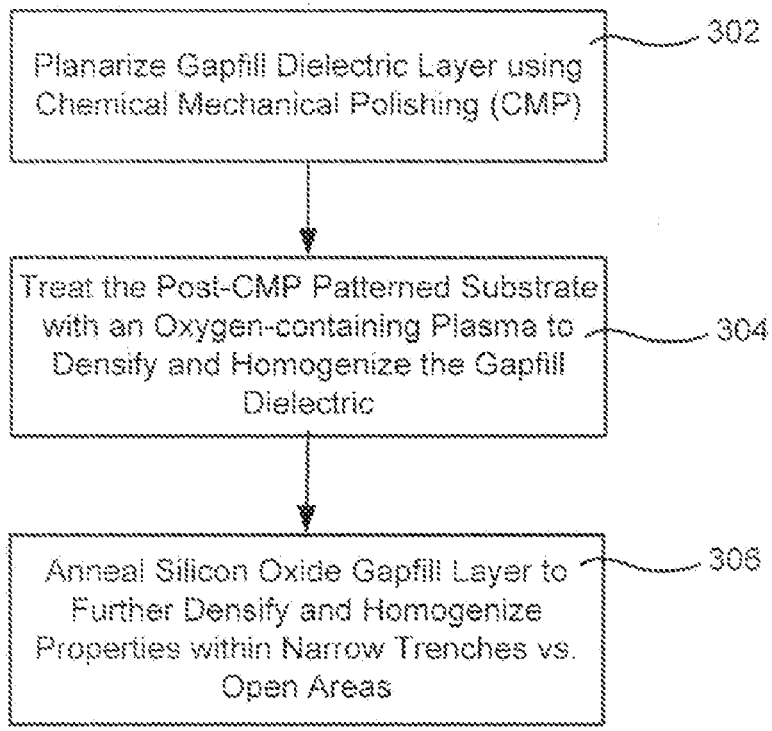
FIG. 3 is another flowchart illustrating selected steps for processing a silicon oxide gapfill film according to disclosed embodiments.

Thermal treatments, such as curing and annealing, are not the only way to increase the density of gapfill silicon oxide within trenches and recessed open areas. Exciting a plasma in a substrate processing region containing the patterned substrate can be used as a replacement for or in addition to the thermal steps (curing and/or annealing) described previously. Such a plasma has also been found to increase the density of gapfill silicon oxide. Plasma and thermal treatments can be performed concurrently and/or sequentially. The plasma treatment can be performed in a separate plasma chamber or in the same chamber used for the other processes described herein. FIG. 3 is a flowchart showing selected steps in methods 300 of processing silicon oxide films according to embodiments of the invention. The method 300 includes planarizing a gapfill silicon oxide layer 302 as in operation 110 of FIG. 1. The patterned substrate is then treated in an oxygen-containing plasma 304 formed from oxygen-containing precursors; exemplary oxygen-containing precursors were listed in the discussion pertaining to operation 108 (and 112) of FIG. 1. The oxygen-containing precursors will typically be accompanied by inert gases such as noble gases (Ne, Ar, etc.). Plasma-excited inert gases substantially without any oxygen-containing precursors have also been found to increase the density of gapfill silicon oxide following a planarization step. Plasma-excited inert gases having both oxygen-containing precursors and hydrogen-containing precursors have also been found to be helpful possibly as a result of the increase in moisture. All these plasma-based processes have been found to increase the density and produce more similar densities within narrow trenches and recessed open areas. The exemplary process of FIG. 3 continues when the silicon oxide gapfill layer is annealed 306 to further densify and homogenize the gapfill layer. When the plasma process and the thermal processes are sequentially applied, the plasma process may precede or follow the thermal process.

During the plasma densification process, a plasma is created in the substrate processing region containing the substrate. Inert and reactive precursors (optionally) are flowed into the substrate processing region and plasma power (e.g. RF or microwave) is applied to the region to excite the gases. Plasma power may be applied in a variety of ways including capacitively and inductively. In some embodiments, RF power may be supplied as a mixed frequency that typically supplies power at a high RF frequency (RF1) of 13.56 MHz and a low RF frequency (RF2) of 360 KHz to enhance the decomposition of reactive species introduced into substrate processing region. The specific frequencies used may vary by locale and are largely determined by communication interference considerations.

The temperature of the substrate may be greater than about 100° C., about 150° C., about 200° C., about 250° C. or about 300° C., in disclosed embodiments. The temperature of the substrate may be less than about 600° C., about 500° C. or about 400° C., in disclosed embodiments. Any of the upper limits on substrate temperature may be combined with any of the lower limits to form additional temperature ranges according to additional disclosed embodiments. The pressure in the substrate processing region may be greater than about 0.5 Torr, 1 Torr, 2 Torr, or 4 Torr, in disclosed embodiments. The pressure in the substrate processing region may be below about 20 Torr, about 15 Torr, about 10 Torr, about 8 Torr or about 6 Torr, in disclosed embodiments. Additional disclosed embodiments may be formed by combining any of the lower limits on pressure with any of the upper limits. When ~13.56 MHz is used to excite the plasma, the RF power may be between about 25 Watts and about 400 Watts, between about 50 Watts and about 350 Watts, between about 100 Watts and about 300 Watts or between about 150 Watts and about 250 Watts in disclosed embodiments. Any of the upper limits on RF power can be combined with any of the lower limits to form additional ranges for power in additional disclosed embodiments.

Exemplary Substrate Processing System

Figure 4:
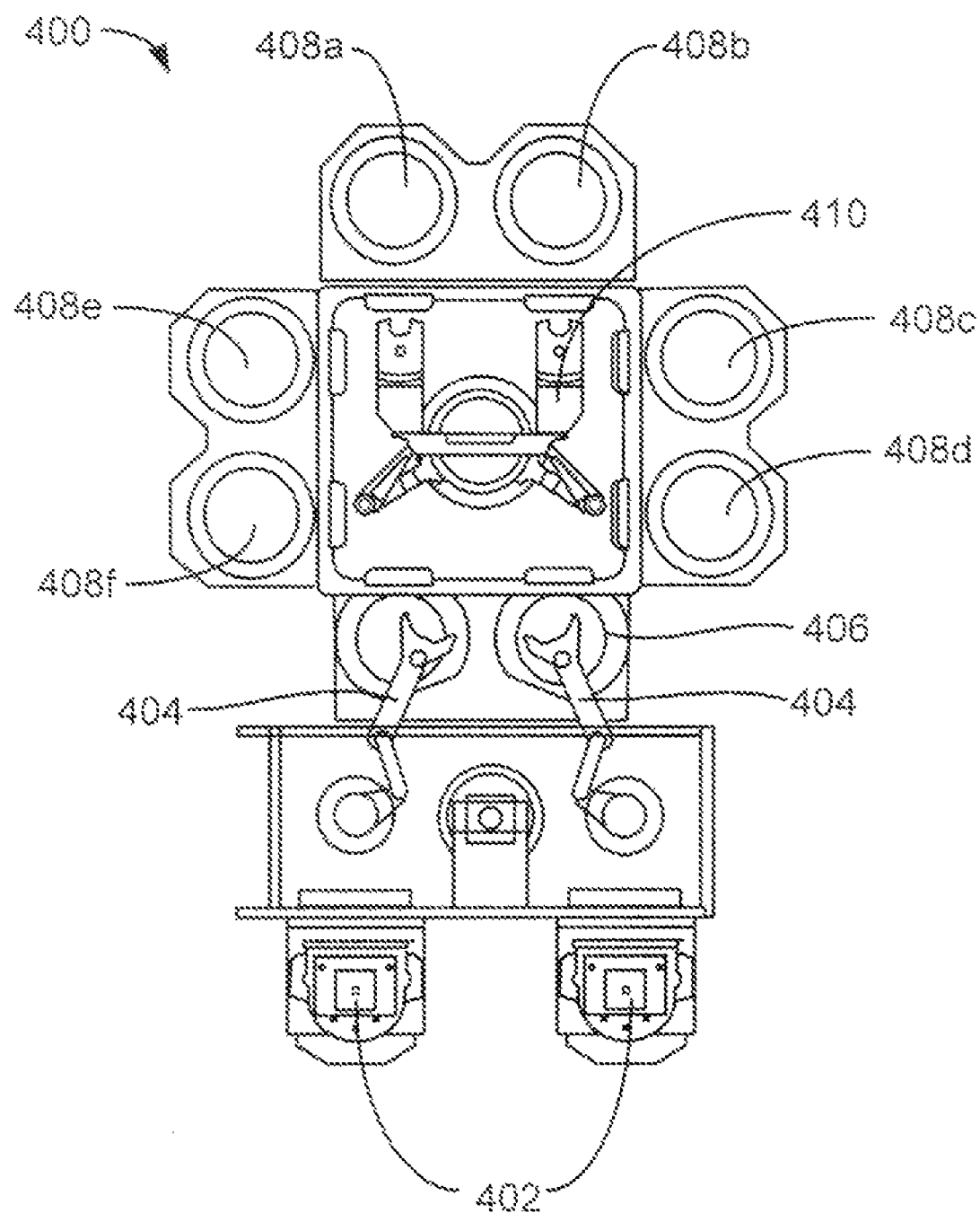
FIG. 4 shows a substrate processing system according to disclosed embodiments.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectric. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit an cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. It will be appreciated, that additional configurations of deposition, annealing and curing chambers for flowable dielectric films are contemplated by system 400.

In addition, one or more of the process chambers 408a-f may be configured as a wet treatment chamber. These process chambers include heating the flowable dielectric film in an atmosphere that includes moisture. Thus, embodiments of system 400 may include wet treatment chambers 408a-b and anneal processing chambers 408c-d to perform both wet and dry anneals on the deposited dielectric film.

Figure 5A:
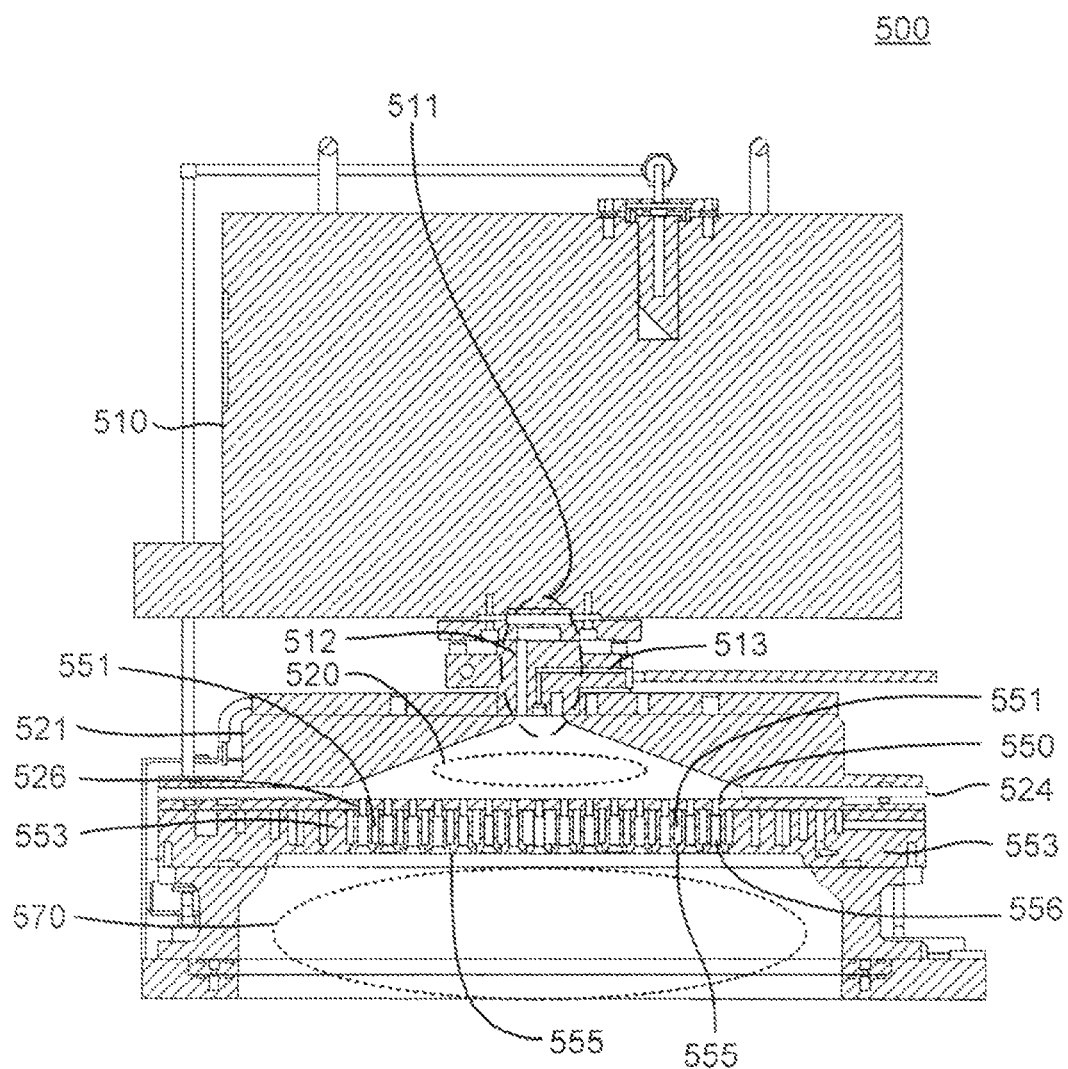
FIG. 5A shows a substrate processing chamber according to disclosed embodiments.

FIG. 5A is a substrate processing chamber 500 according to disclosed embodiments. A remote plasma system (RPS) 510 may process a gas which then travels through a gas inlet assembly 511. Two distinct gas supply channels are visible within the gas inlet assembly 511. A first channel 512 carries a gas that passes through the remote plasma system RPS 510, while a second channel 513 bypasses the RPS 500. The first channel 502 may be used for the process gas and the second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this disclosed embodiment. In order to maintain a significant concentration of excited species penetrating from chamber plasma region 520 to substrate processing region 570, the length 526 of the smallest diameter 550 of the through-holes may be restricted by forming larger diameter portions of through-holes 556 part way through the showerhead 553. The length of the smallest diameter 550 of the through-holes 556 may be the same order of magnitude as the smallest diameter of the through-holes 556 or less in disclosed embodiments.

In the embodiment shown, showerhead 553 may distribute (via through holes 556) process gases which contain oxygen, hydrogen and/or nitrogen and/or plasma effluents of such process gases upon excitation by a plasma in chamber plasma region 520. In embodiments, the process gas introduced into the RPS 510 and/or chamber plasma region 520 through first channel 512 may contain one or more of oxygen ($O_2$), ozone ($O_3$), $N_2O$, NO, $NO_2$, $NH_3$, $N_xH_y$ including N2H4, silane, disilane, TSA and DSA. The process gas may also include a carrier gas such as helium, argon, nitrogen ($N_2$), etc. The second channel 513 may also deliver a process gas and/or a carrier gas, and/or a film-curing gas used to remove an unwanted component from the growing or as-deposited film. Plasma effluents may include ionized or neutral derivatives of the process gas and may also be referred to herein as a radical-oxygen precursor and/or a radical-nitrogen precursor referring to the atomic constituents of the process gas introduced.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
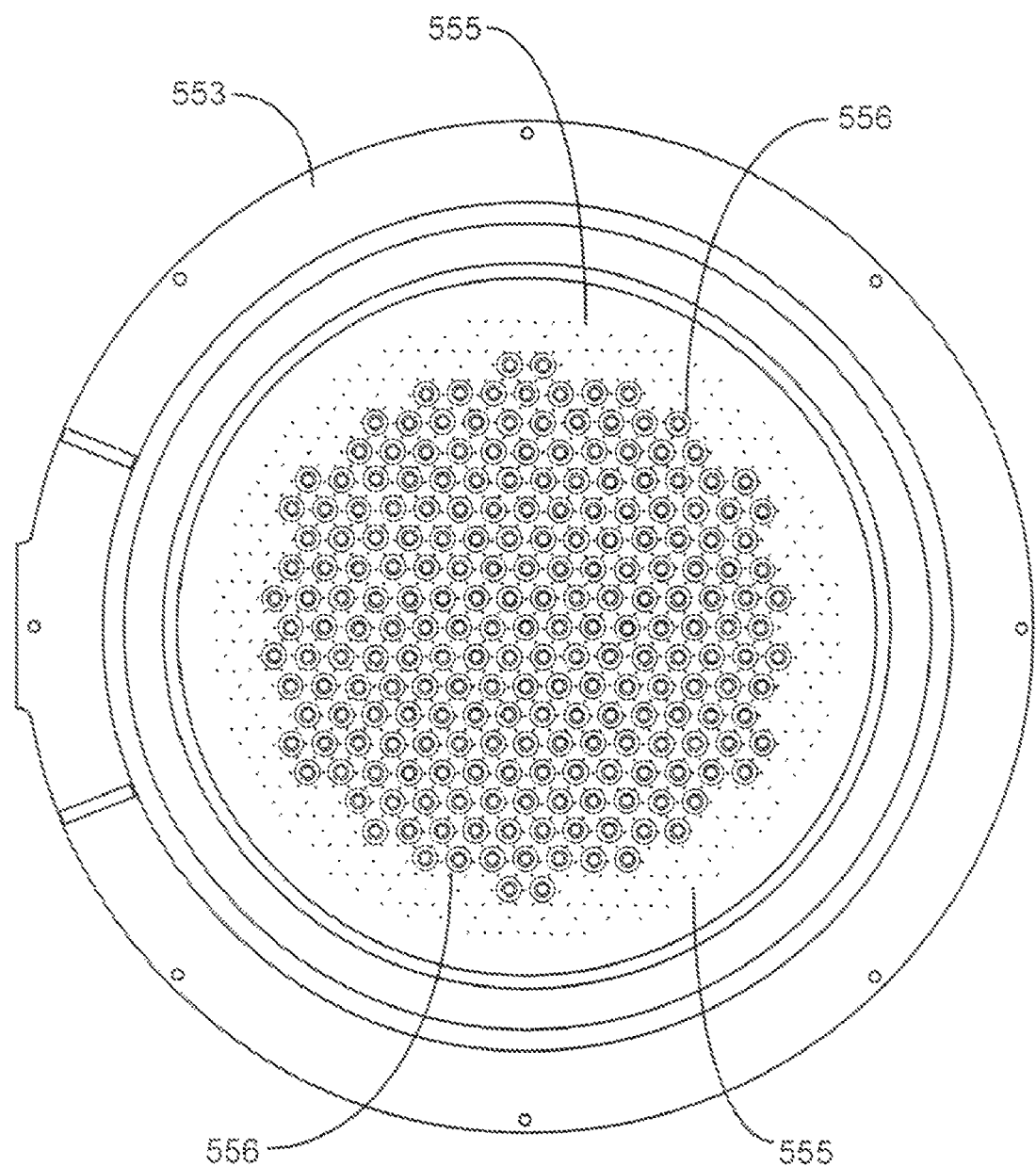
FIG. 5B shows a showerhead of a substrate processing chamber according to disclosed embodiments.

FIG. 5B is a bottom view of a showerhead 553 for use with a processing chamber according to disclosed embodiments. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing than other embodiments described herein.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. An AC voltage typically in the radio frequency (RF) range is applied between the conductive top portion 521 of the processing chamber and showerhead 553 to ignite a plasma in chamber plasma region 520 during deposition. The top plasma is left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region 570 while the plasma is present.

The radical nitrogen precursor is created in the remote plasma region and travels into the substrate processing region where the silicon-containing precursor is excited by the radical nitrogen precursor. In embodiments, the silicon-containing precursor is excited only by the radical nitrogen precursor. Plasma power may essentially be applied only to the remote plasma region, in embodiments, to ensure that the radical nitrogen precursor provides the predominant excitation to the silicon-containing precursor.

In embodiments employing a chamber plasma region, the excited plasma effluents are generated in a section of the substrate processing region partitioned from a deposition region where the precursors mix and react to deposit the silicon-and-nitrogen layer on a deposition substrate (e.g., a semiconductor wafer). The excited plasma effluents are also accompanied by a unexcited inert gases (in the exemplary case, argon). The substrate processing region may be described herein as "plasma-free" during the growth of the silicon-and-nitrogen-containing layer, for example. "Plasma-free" does not necessarily mean the region is devoid of plasma. Ionized species and free electrons created within the plasma region do travel through pores (apertures) in the partition (showerhead) but the carbon-free silicon-containing precursor is not substantially excited by the plasma power applied to the plasma region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

The substrate may be heated in an inert atmosphere in a thermal densification process. The heat may be supplied by the pedestal which may contain a resistive heating element to raise the substrate temperature. During a plasma densification process, an RF power supply 540 applies electrical power between showerhead 553 and the pedestal beneath the components pictured in FIG. 5A. The plasma power excites the process gas mixture to form a plasma within the roughly cylindrical region between showerhead 553 and the substrate supported by pedestal. Showerhead 553 has either a conducting surface or the surface may be insulating and covering a metal insert. Regardless of position, the metal portion of showerhead 553 is electrically isolated from the rest of CVD chamber 500 via dielectric inserts which allow the voltage of showerhead 553 to be varied with respect to the support pedestal and lid 520. The lid 521 and support pedestal are also electrically separated so a plasma can be created in substrate processing region 570 without creating a plasma in chamber plasma region 520.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" and "silicon-and-oxygen-containing layer" are used interchangeably herein and may include significant concentrations of other elemental constituents such as nitrogen, hydrogen, carbon and the like. A gas in an "excited state" as used herein describes a gas wherein at least some of the gas molecules are in vibrationally-excited, dissociated and/or ionized states. A gas may be a combination of two or more gases. The term trench is used throughout with no implication that the etched geometry necessarily has a large horizontal aspect ratio. Viewed from above the surface, trenches may appear circular, oval, polygonal, rectangular, or a variety of other shapes. The term "precursor" is used to refer to any process gas which takes part in a reaction to either remove or deposit material from a surface. The phrase "inert gas" refers to any gas which does not form chemical bonds when incorporated into a film. Exemplary inert gases include noble gases but may include other gases so long as no chemical bonds are formed when (typically) trace amounts are trapped in a film. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Densities have been evaluated herein by measuring the wet etch rate (WER) and calculating a wet etch rate ratio (WERR). These measurements were made by performing a timed etch in a hydrofluoric acid based solution and calculating the etch rate in nanometers per second. A WERR is typically created by comparing the etch rate of a dielectric sample with that of a thermal silicon oxide in the same solution. A common buffered oxide etch solution includes a 6:1 volume ratio of 40% $NH_4F$ in water to 49% HF in water. This solution will etch thermally grown silicon oxide at approximately 2 nanometres per second at 25° C. Other methods of forming silicon oxide will typically result in silicon oxide films having faster wet etch rates. Faster wet etch rates generally imply that the candidate silicon oxide film has a lower density than thermally grown silicon oxide. In some cases, a wet etch rate ratio will be used to compare two non-thermal silicon oxide films (or different portions of the same film) and the context will make the distinction.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of processing a silicon-and-oxygen-containing layer on a patterned substrate having a narrow trench and a recessed open area, the method comprising:

forming a carbon-free silicon-and-nitrogen-containing layer on the patterned substrate including in the narrow trench and in the recessed open area by chemical vapor deposition and converting the carbon-free silicon-and-nitrogen-containing layer to the silicon-and-oxygen-containing layer;

planarizing the silicon-and-oxygen-containing layer leaving a narrow gapfill portion in the narrow trench and a wide gapfill portion in the recessed open area, wherein planarizing the silicon-and-oxygen-containing layer comprises removing a portion of the silicon-and-oxygen-containing layer above the narrow trench and exposing a post-planarization dielectric interface disposed closer to the narrow trench than a corresponding pre-planarization dielectric interface; and treating the substrate, after the planarizing operation, to increase a density of the narrow gapfill portion, wherein the post-planarization dielectric interface disposed closer to the narrow trench allows the narrow gapfill portion to become denser than had the substrate been treated before the planarizing operation.

2. The method of claim 1 wherein forming the silicon-and-oxygen-containing layer comprises:

flowing a plasma precursor into a remote plasma region to form plasma effluents;

combining the plasma effluents with a flow of a silicon-containing precursor in a substrate processing region, wherein the flow of the silicon-containing precursor has not been excited by a plasma; and curing the silicon-and-nitrogen-containing layer in an ozone containing atmosphere to convert the layer into a silicon-and-oxygen-containing layer.

3. The method of claim 1 wherein the open area is a wide trench having a width greater than one of 50 nm, 100 nm, 200 nm, 500 nm or 1000 nm.

4. The method of claim 1 wherein the narrow trench has a width less than one of 100 nm, 70 nm, 50 nm, 35 nm, 25 nm or 20 nm.

5. The method of claim 1 wherein the etch rate of the wide gapfill portion, after treating the substrate to increase a density, is within one of 20%, 15%, 10%, 7%, 5% or 3% of the etch rate of the narrow gapfill portion.

6. The method of claim 1 wherein the operation of treating the substrate to increase a density comprises exposing the substrate to a plasma in an atmosphere comprising an inert gas.

7. The method of claim 6 wherein the atmosphere further comprises oxygen.

8. The method of claim 7 wherein the atmosphere further comprises hydrogen.

9. The method of claim 1 wherein the operation of treating the substrate to increase a density comprises annealing the substrate above or about 400° C., 500° C., 600° C., 700° C. or 800° C. increase the density of the narrow gapfill portion.

10. The method of claim 1 wherein the operation of planarizing the silicon-and-oxygen-containing layer comprises chemical-mechanically polishing the substrate.

11. The method of claim 1 wherein the operation of planarizing the silicon-and-oxygen-containing layer comprises performing a planarizing etch on the substrate.

12. The method of claim 1 wherein the operation of treating the substrate to increase a density also results in an increase in density of the wide gapfill portion.

13. The method of claim 1 wherein the operation of treating the substrate to increase a density comprises sequentially exposing the substrate to a plasma and then annealing the substrate.

14. The method of claim 1 wherein the operation of treating the substrate to increase a density comprises sequentially annealing the substrate and then exposing the substrate to a plasma.

15. The method of claim 1 further comprising annealing the silicon-and-oxygen-containing layer in an oxygen-containing atmosphere at a substrate temperature greater than one of 500° C., 600° C., 700° C. or 800° C. before planarizing the silicon-and-oxygen-containing layer.

16. The method of claim 1 wherein the silicon-and-oxygen-containing layer consists essentially of silicon and oxygen after the operation of treating the silicon-and-oxygen-containing layer.

* * * * *